(12) United States Patent
Wang et al.

(10) Patent No.: US 8,878,516 B2
(45) Date of Patent: Nov. 4, 2014

(54) INVERTER CURRENT MEASUREMENT USING A SHUNT RESISTOR

(75) Inventors: Jin Wang, Shanghai (CN); Zhenyu Yu, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 374 days.

(21) Appl. No.: 12/812,429

(22) PCT Filed: Jul. 9, 2009

(86) PCT No.: PCT/CN2009/000779
§ 371 (c)(1),
(2), (4) Date: Jan. 5, 2012

(87) PCT Pub. No.: WO2011/003220
PCT Pub. Date: Jan. 13, 2011

(65) Prior Publication Data
US 2012/0113701 A1 May 10, 2012

(51) Int. Cl.
*G01R 35/06* (2006.01)
*H02M 7/5387* (2007.01)
*G01R 31/42* (2006.01)
*H02M 1/00* (2006.01)
*G01R 19/00* (2006.01)

(52) U.S. Cl.
CPC .......... *H02M 7/53875* (2013.01); *G01R 31/42* (2013.01); *H02M 2001/0009* (2013.01); *G01R 19/0092* (2013.01)

USPC .................................................... 324/76.11

(58) Field of Classification Search
USPC .................................................... 324/76.11
See application file for complete search history.

(56) References Cited

U.S. PATENT DOCUMENTS

2003/0173946 A1* 9/2003 Liu et al. .................. 324/107

OTHER PUBLICATIONS

Texas Instruments TMS320LF2406 DSP controller data sheet, 1999.*

* cited by examiner

*Primary Examiner* — Melissa Koval
*Assistant Examiner* — Daniel Miller
(74) *Attorney, Agent, or Firm* — Robert D. Marshall, Jr.; Frederick J. Telecky, Jr.

(57) ABSTRACT

A method for determining each current output of a three-phase inverter (102) comprises the following steps: inspecting an initial set of control signals for the inverter (102); identifying a measurement conflict when at least two of said control signals are asserted within a predetermined amount of time of each; if there is a measurement conflict, providing a first modified set of control signals to the inverter by shifting a position of at least one control signal related to the measurement conflict; and measuring a current through a shunt resistor based on the first modified set of control signals. Also, an electronic device and a digital processor (DSP) for determining each current output of three-phase inverter (102) are provided.

17 Claims, 9 Drawing Sheets

INVERTER CURRENT MEASUREMENT USING A SHUNT RESISTOR

BACKGROUND

Most inverter control systems require knowledge of the phase currents. The simplest method of obtaining these currents is to measure them directly. Depending on the motor winding connections, this requires at least two sensors to be applied directly to the motor phases. Usually, these types of sensors are expensive due to their need to be isolated. There is a second method of measuring these phase currents using a simple, cheap resistor. However, under certain conditions, the measurement becomes difficult and even impossible due to hardware limitations. Improved inverter current measurement solutions are desirable.

SUMMARY

In at least some embodiments, a method for determining each current output of a three-phase inverter comprises inspecting an initial set of control signals for the inverter and identifying a measurement conflict when at least two of the control signals are asserted within a predetermined amount of time of each other. If there is a measurement conflict, the method further comprises providing a first modified set of control signals to the inverter by shifting a position of at least one control signal related to the measurement conflict. The method further comprises measuring a current through a shunt resistor based on the first modified set of control signals.

In at least some embodiments, an electronic device comprises a three-phase inverter and a shunt resistor coupled to the three-phase inverter. The electronic device further comprises control logic coupled to the inverter. The control logic determines each current output of the three-phase inverter by inspecting an initial set of control signals for the inverter and identifying a measurement conflict when at least two of the initial set of control signals are asserted within a predetermined amount of time of each other. If there is a measurement conflict, the control logic provides a first modified set of control signals to the three-phase inverter. The first modified set of control signals avoids the measurement conflict and has a voltage vector approximately equal to the initial set of PWM control signals. The control logic further measures a current through the shunt resistor based on the first modified set of control signals.

In at least some embodiments, a digital signal processor (DSP) for determining each current output of a three-phase inverter comprises pulse width modulation (PWM) control lines and an analog-to-digital converter (ADC). The DSP further comprising a processor coupled to the PWM control lines and the ADC. The DSP further comprises memory coupled to the processor. The memory stores instructions that cause the processor to inspect timing parameters of an initial set of PWM control signals and identify a measurement conflict for the ADC when at least two of the PWM control signals are to be asserted within a predetermined amount of time of each other. If there is a measurement conflict, the instructions further cause the processor to provide a first modified set of PWM control signals to the PWM control lines. The first modified set of PWM control signals avoids the measurement conflict and has a voltage vector approximately equal to the initial set of control signals. The instructions further cause the processor to determine each current output of a three-phase inverter using ADC samples based on the first modified set of PWM control signals.

BRIEF DESCRIPTION OF THE DRAWINGS

For a detailed description of various embodiments of the invention, reference will now be made to the accompanying drawings in which.

NOTATION AND NOMENCLATURE

Figure 1:
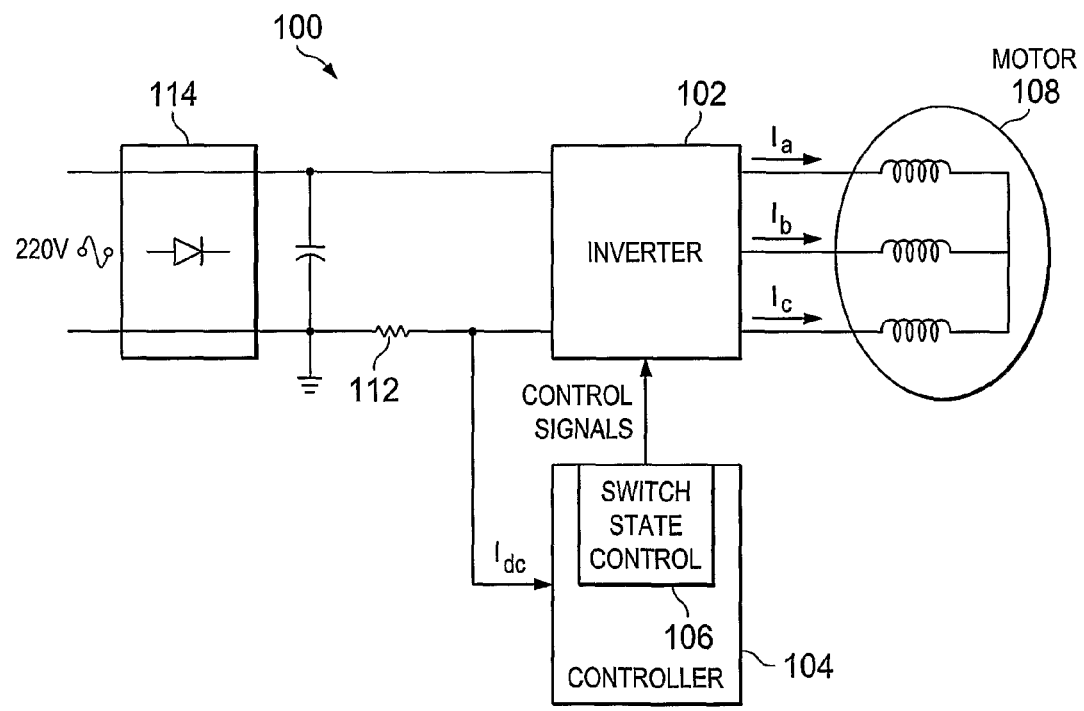
FIG. 1 shows a system in accordance with an embodiment of the disclosure.

Certain terms are used throughout the following description and claims to refer to particular system components. As one skilled in the art will appreciate, computer companies may refer to a component by different names. This document doe not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections. The term "system" refers to a collection of two or more hardware and/or software components, and may be used to refer to an electronic device or devices or a sub-system thereof.

DETAILED DESCRIPTION

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Embodiments of the disclosure are directed to methods and systems to measure a three-phase current output from an inverter by measuring the current through a shunt resistor. In accordance with embodiments, an initial set of inverter control signals are analyzed to identify whether a current measurement conflict exists. If a measurement conflict exists, a first modified set of inverter control signals replaces the initial set of control signals. The first modified set of control signals avoids the measurement conflict while maintaining a consistent voltage output compared to the initial set of control signals. Using the first modified set of control signals, the current outputs of the three-phase inverter are determined based on two direct measurements and one deduced measurement. As used herein, a "direct measurement" refers to calculating a current based on Ohm's law (I=V/R; with or without scaling). As used herein, a "deduced measurement" refers to calculating two currents based on Ohm's law (I=V/R; with or without scaling) and then deducing a third current (e.g., based on the formula $I_a+I_b+I_c=0$). If a measurement conflict does not exist, a second modified set of inverter control signals may replace the initial set of control signals. The second modified set of control signals maintains a consistent voltage output compared to the initial set of control signals. Using the second modified set of control signals, the current outputs of the three-phase inverter are determined based on one direct measurement and two deduced measurements. Additional details will be provided hereafter.

FIG. 1 illustrates a system 100 in accordance with embodiments of the disclosure. As shown, the system 100 comprises an inverter 102 that receives a direct current (DC) voltage from a rectifier 114 or other DC voltage source. The output of the inverter 102 is controlled by a controller 104, which provides control signals to the inverter 102. For example, in FIG. 1, the controller 104 comprises switch state control logic 106 to generate the control signals. The output of the inverter 102 may power a motor 108 or other electronic device. In various embodiments, the output of the inverter 102 needs to be dynamically monitored and controlled in order to power the motor 108 or other electronic device as desired. In accordance with embodiments, the current $I_{dc}$ is monitored by the controller 104 and is used to determine subsequent parameters (timing, on/off time, duty cycle) of the control signals for the inverter 102. The accuracy of $I_{dc}$ measurements are affected by the hardware being used to measure $I_{dc}$ as will be described herein.

Figure 2:
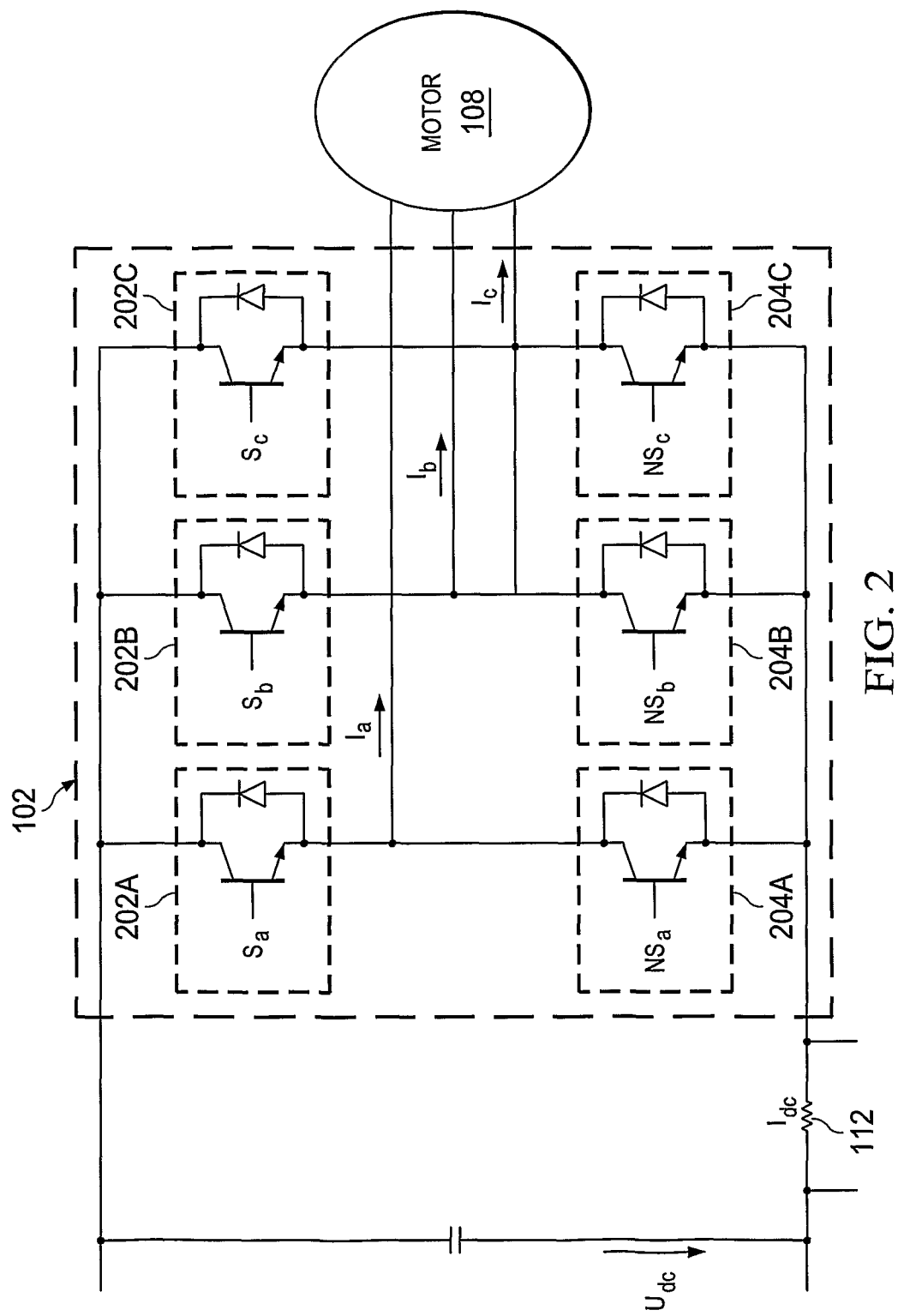
FIG. 2 illustrates switch components of the inverter of FIG. 1 in accordance with an embodiment of the disclosure.

FIG. 2 illustrates switch components of the inverter 102 of FIG. 1 in accordance with embodiments of the disclosure. As shown in FIG. 2, the inverter 102 comprises a plurality of switches 202A, 202B and 202C with respective complementary switches 204A, 204B, and 204C. In other words, when switch 202A is closed, switch 204A is open and vice versa. Likewise, when switch 202B is closed, switch 204B is open and vice versa. Likewise, when switch 202C is closed, switch 204C is open and vice versa. As shown, the switches 202A-202C and 204A-204C may each comprise a transistor with a diode between the source and drain electrodes. The switch 202A is controlled by control signal $S_a$, the switch 202B is controlled by control signal $S_b$, and the switch 202C is controlled by control signal $S_c$. Meanwhile, the switch 204A is controlled by control signal $NS_a$, the switch 204B is controlled by control signal $NS_b$, and the switch 204C is controlled by control signal $NS_c$ (where $NS_a$ is the opposite of $S_a$, $NS_b$ is the opposite of $S_b$, $NS_c$ is the opposite of $S_c$). In accordance with embodiments, $I_{dc}$ measurements based on the control signals $S_a$, $S_b$ and $S_c$ are illustrated in Table 1.

TABLE 1

| $S_a$ | $S_b$ | $S_b$ | $I_{dc}$ |
|---|---|---|---|
| 1 | 0 | 0 | $I_a$ |
| 0 | 1 | 1 | $-I_a$ |
| 0 | 1 | 0 | $I_b$ |
| 1 | 0 | 1 | $-I_b$ |
| 0 | 0 | 1 | $I_c$ |
| 1 | 1 | 0 | $-I_c$ |
| 1 | 1 | 1 | 0 |
| 0 | 0 | 0 | 0 |

As shown in Table 1, the measured value of $I_{dc}$ may be equal to $I_a$, $-I_a$, $I_b$, $-I_b$, $I_c$, $-I_c$, or 0 depending on the values of the control signals $S_a$, $S_b$ and $S_c$. In Table 1, the control signal values "0" and "1" refer to non-asserted (low) and asserted (high) voltage levels respectively.

Figure 3:
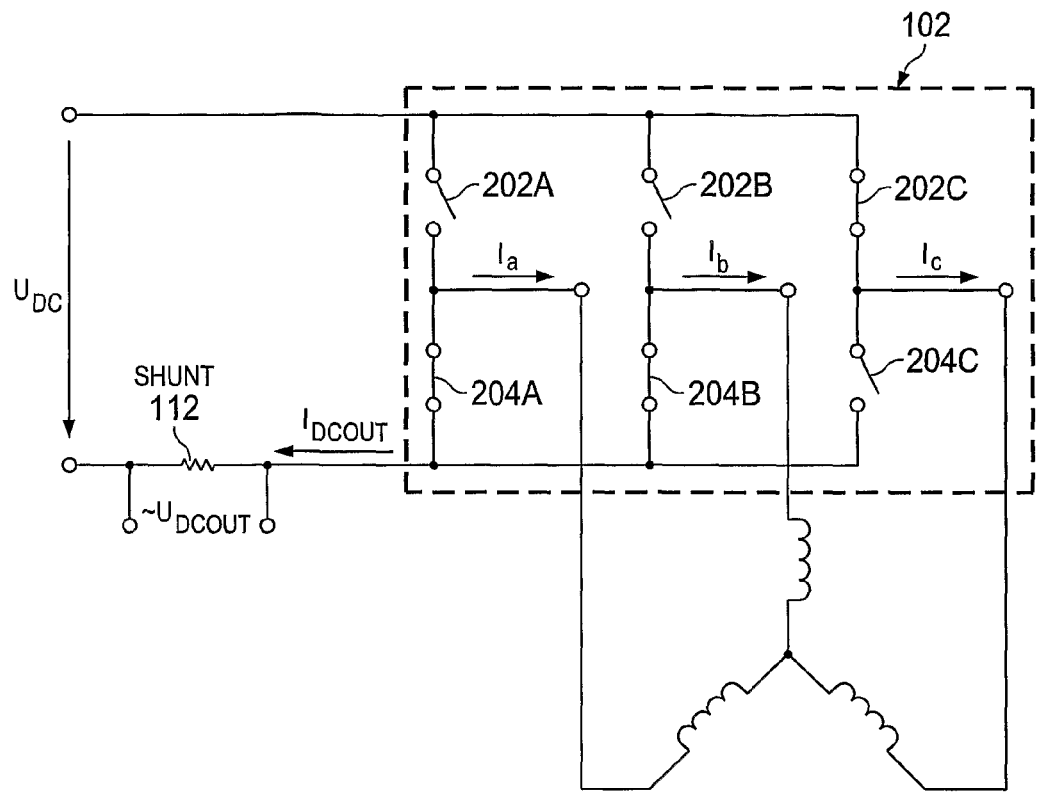
FIG. 3 shows a switch configuration for the inverter of FIG. 1 when the control signals $(S_a, S_b, S_c)=(0, 0, 1)$.

FIG. 3 shows a switch configuration for the inverter 102 when the control signals $(S_a, S_b, S_c)=(0, 0, 1)$. In FIG. 3, $S_a=0$ causes switch 202A to be open, $S_b=0$ causes switch 202B to be open, and $S_c=1$ causes switch 202C to be closed. Meanwhile, the complementary switches 204A-204C are oppositely configured. More specifically, switch 204A is closed while switch 202A is open, switch 204B is closed while switch 202B is open, and switch 204C is open while switch 202C is closed. For the switch configuration of FIG. 3, $I_{dc}$ measured across the shunt resistor 112 is $I_c$.

Figure 4:
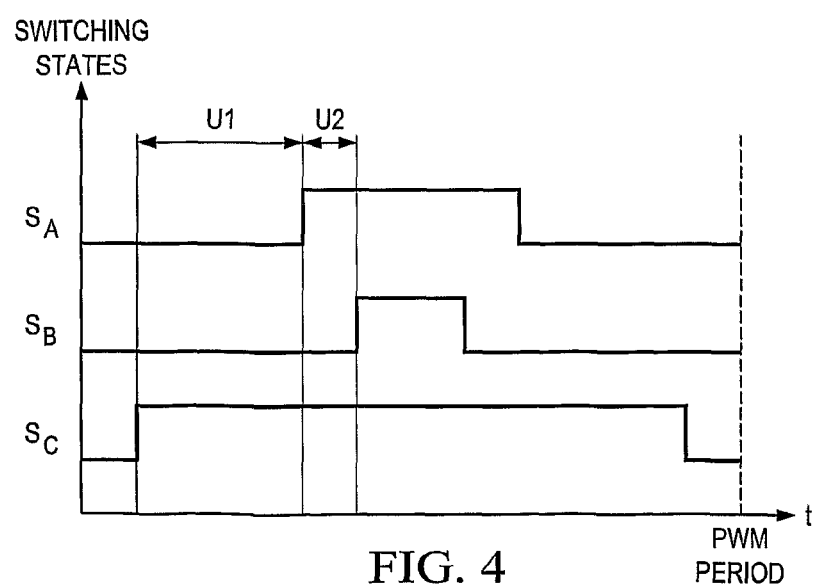
FIG. 4 shows control signal transitions in accordance with an embodiment of the disclosure.

In order for $I_{dc}$ to be accurately measured across the shunt resistor 112, $I_{dc}$ should remain steady during a current sampling period. For at least some embodiments, this current sampling period is determined by an analog-to-digial converter (ADC) sample-and-hold (S/H) period. FIG. 4 shows control signal transitions in accordance with an embodiment of the disclosure. In FIG. 4, the control signals $S_a$, $S_b$, and $S_c$ are shown for the duration of a pulse width modulation (PWM) period. In FIG. 4, $I_{dc}$ is to be measured during the periods U1 and U2. U1 corresponds to when $(S_a, S_b, S_c)=(0, 0, 1)$ and U2 corresponds to when $(S_a, S_b, S_c)=(1, 0, 1)$. Before U1 and after U2, $I_{dc}$ is zero and thus $I_{dc}$ measurements do not provide useful information regarding the inverter outputs ($I_a$, $I_b$, and $I_c$). In order for $I_{dc}$ to be accurately measured across the shunt resistor 112, the duration of each U1 and U2 period should be at least a current sampling period (e.g., an ADC S/H period) or longer. It should be understood that the duty cycles of control signals $S_a$, $S_b$, and $S_c$ may be configured differently from the examples shown in FIG. 4. Further it should be understood that the configured duty cycles for control signals $S_a$, $S_b$, and $S_c$ may vary and/or shift over time causing the U1 and U2 periods to vary. Thus, the issue of determining and accounting for $I_{dc}$ measurement conflicts is dynamic.

Returning to FIG. 1, the controller 104 is able to dynamically detect when the U1 or U2 periods have insufficient duration for an accurate $I_{dc}$ measurement. For example, the controller 104 may analyze an initial set of inverter control signals and may identify a current measurement conflict when the U1 or U2 periods are less than a predetermined threshold (e.g., an ADC S/H period). If a measurement conflict is identified, the controller 104 generates a first modified set of inverter control signals to replace the initial set of control signals. The first modified set of control signals avoids the measurement conflict while maintaining a consistent voltage output compared to the initial set of control signals. In at least some embodiments, the controller 104 provides the first modified set of control signals by nullifying one of the initial control signals (e.g., the control signal that has the least width), reducing an "on" period for the other two initial control signals related to the measurement conflict, and shifting the control signals with reduced "on" periods in opposite directions. The amount of shifting should be sufficient to overcome the measurement conflict, but not so much as to move the shifted control signals beyond the initial control signal cycle. The controller 104 is then able to measure $I_{dc}$ through the shunt resistor 112 based on the first modified set of control signals. In accordance with some embodiments, the first modified set of control signals enables the controller 104 to determine the current outputs ($I_a$, $I_b$, $I_c$) of the inverter 102 in a single control signal cycle based on two direct measurements and one deduced measurement.

If a measurement conflict is not identified, the controller 104 generates a second modified set of inverter control signals to replace the initial set of control signals. The second modified set of control signals maintains a consistent voltage output compared to the initial set of control signals. In at least some embodiments, the controller 104 provides the second modified set of control signals by shifting the smallest initial control signal to be aligned (rising edges or falling edges) with the largest initial control signal. The controller 104 is then able to measure $I_{dc}$ through the shunt resistor 112 based on the second modified set of control signals. In accordance with some embodiments, the second modified set of control signals enables the controller 104 to determine the current outputs ($I_a$, $I_b$, $I_c$) of the inverter 102 in a single control signal cycle based on one direct measurement and two deduced measurements.

Figure 5A:
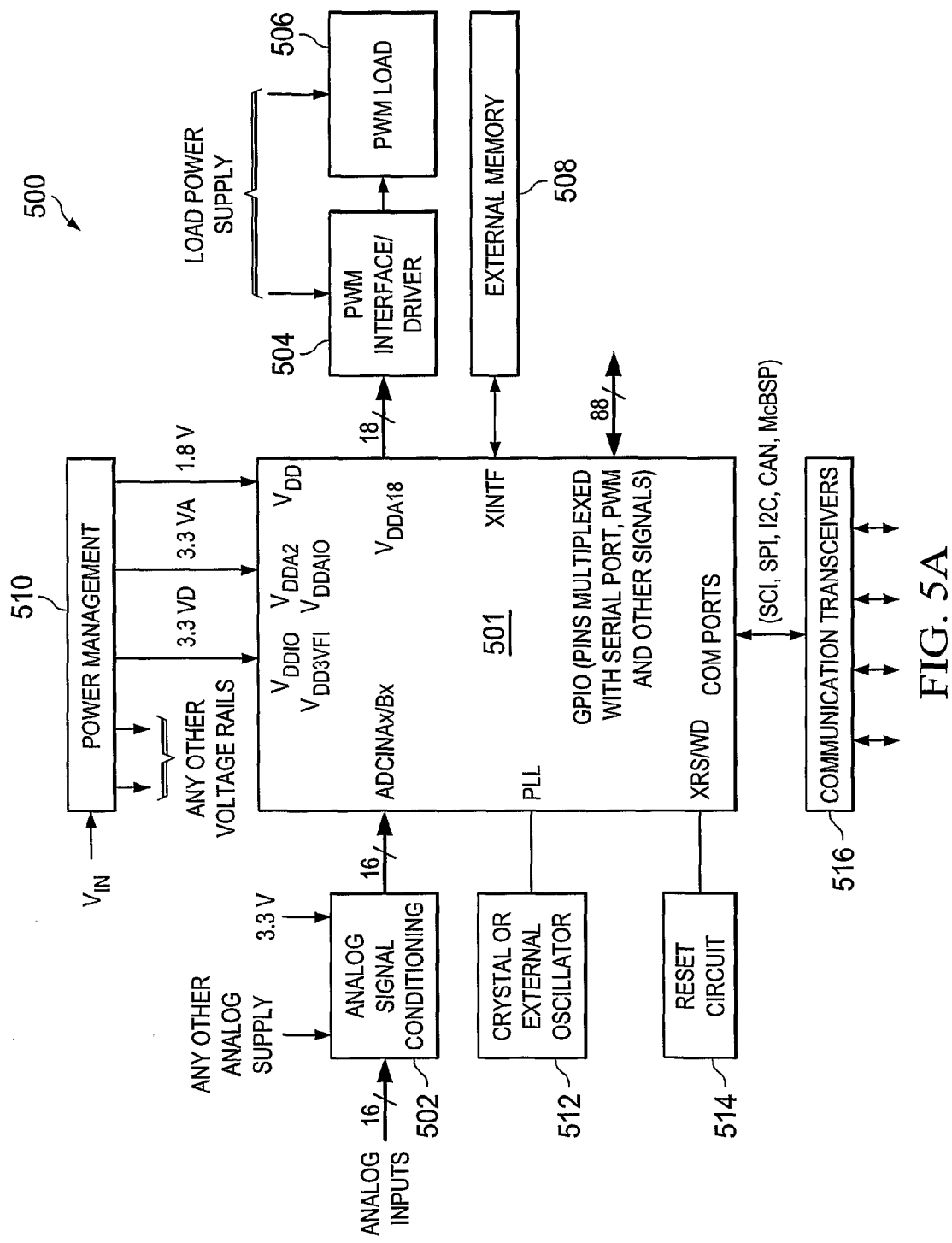
FIG. 5A shows a Digital Signal Processor (DSP) system in accordance with an embodiment of the disclosure.

In accordance with at least some embodiments, the controller 104 comprises a digital signal processor (DSP). Among other features, the DSP should be able to dynamically sample a voltage across the shunt resistor 112 (ADC samples), compute the current outputs ($I_a$, $I_b$, $I_c$) of the inverter 102, and provide control signals to the inverter 102. FIG. 5A shows a DSP system 500 in accordance with an embodiment of the disclosure. As shown in FIG. 5A, the DSP system 500 comprises a DSP 501 capable of performing the functions described herein. The DSP 501 may correspond to the controller 104 of FIG. 1. In at least some embodiments, the DSP 501 represents a TMS320F28 architecture or other DSP architecture.

In FIG. 5A, the DSP 501 comprises various inputs and outputs that couple to different supplemental circuits 502, 504, 506, 508, 510, 512, 514 and 516. More specifically, a reset input (XRS/WD) of the DSP 501 couples to a reset circuit 514. A phase-locked loop (PLL) input of the DSP 501 couples to a crystal or other external oscillator 512. A communication (COM) port of the DSP 501 couples to communication transceivers 516. An external interface (XINTF) port of the DSP 501 couples to an external memory 508. Also, various power inputs for the DSP 501 couple to a power management circuit 510.

Figure 5B:
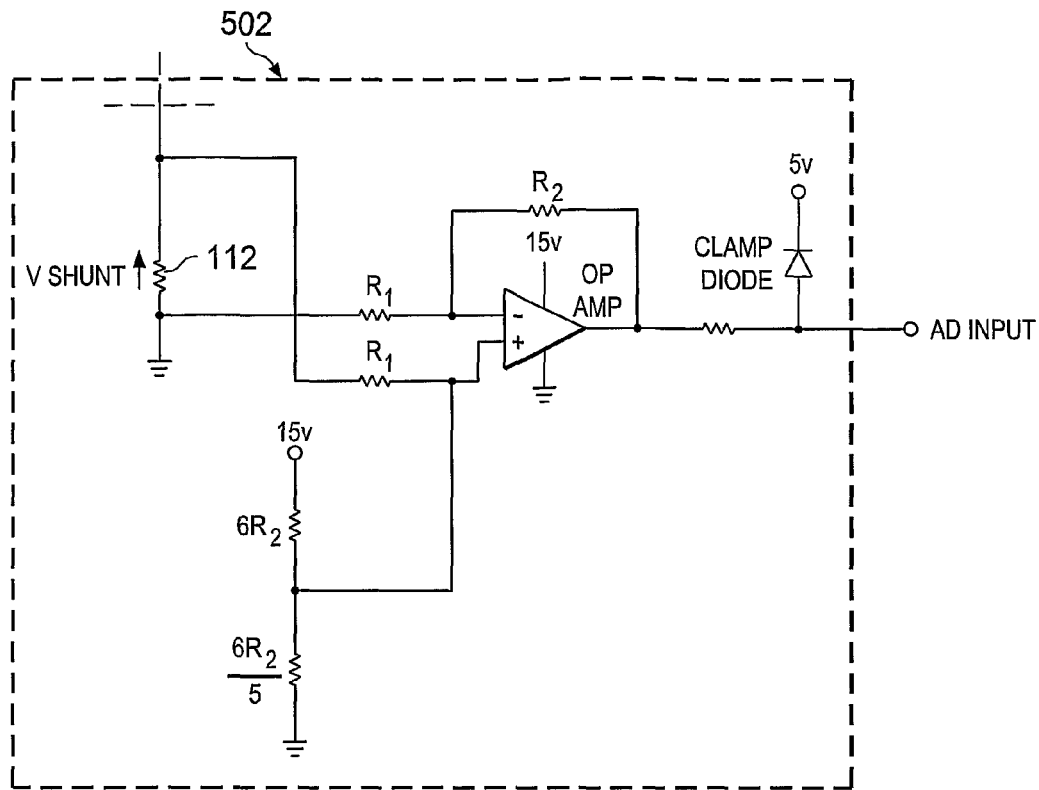
FIG. 5B shows components of the analog signal conditioning circuit of FIG. 5A in accordance with an embodiment of the disclosure.

Of particular interest for this disclosure are the ADC inputs (ADCINAx/Bx) and the control signal outputs ($V_{DDA18}$) of the DSP 501. As shown, the ADC inputs couple to an analog signal conditioning circuit 502. FIG. 5B shows components of the analog signal conditioning circuit 502 of FIG. 5A in accordance with an embodiment of the disclosure. The components of FIG. 5B include the shunt resistor 112 whose value is selected to ensure a low dissipated power $RI^2$ and/or a voltage drop ($V_{shunt}$) large enough to achieve a reasonable ADC scaling gain. For example, in order to achieve an ADC input range between 0-5 Volts with $I_{dc}$ between −10 to 10 amps, a shunt resistor value of 25 mΩ (a maximum of 2.5 Watts dissipation) and an operational amplifier (op amp) gain of 10 may be used. The op amp should have a bandwidth high enough to detect $I_{dc}$ transitions. Further, if the ADC input is to be scaled in the range of 0-5 Volts, an offset voltage of 2.5V may be applied to the ADC input. Further, if the op amp supply in is 15V, a clamp diode is used to limit the ADC input voltage to 5V. In the example given for FIG. 5B, $$ADC_{input} = \frac{R_2}{R_1} V_{shunt} + 2.5.$$

Because the value of $R_{shunt}$ is known and the value of $V_{shunt}$ can be determined from the ADC input, the DSP 501 is able to determine the value of $I_{shunt}$. In accordance with at least some embodiments, $I_{shunt}=I_{dc}$ of an inverter such as inverter 102.

Returning to the control signal outputs ($V_{DDA18}$) of the DSP 501, FIG. 5A shows that these control signal outputs are provided to a PWM interface/driver circuit 504. Based on the control signals, the PWM interface/driver circuit 504 provides PWM signals to a PWM load 506. In accordance with at least some embodiments, the PWM load 506 corresponds to an inverter (e.g., the inverter 102). Because the DSP 501 provides the control signals for the inverter 102, the DSP 501 is able to specifically correlate $I_{shunt}$ with one of the $I_a$, $I_b$, or $I_c$ outputs of the inverter 102. The DSP 501 may identify $I_a$, $I_b$, or $I_c$ directly or may deduce $I_a$, $I_b$, or $I_c$ by determining the combined value of two of the currents and calculating the remaining current using the formula $I_a+I_b+I_c=0$. If the inverter 102 is controlled to output each of $I_a$, $I_b$, or $I_c$ during a single PWM cycle, the DSP 501 is able to sample $I_{shunt}$ multiple times during a single PWM cycle to determine $I_a$, $I_b$, and $I_c$. The DSP 501 may subsequently adjust the control signal for the inverter 102 based on the determined values for $I_a$, $I_b$, and $I_c$.

Figure 5C:
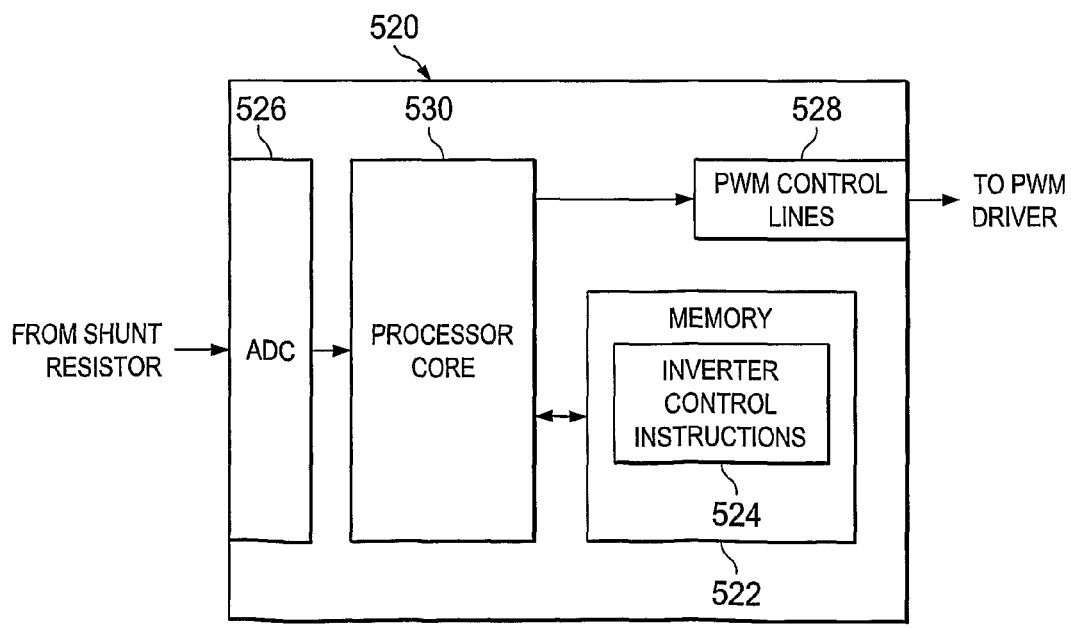
FIG. 5C illustrates components of a DSP in accordance with an embodiment of the disclosure.

FIG. 5C illustrates components of a DSP 520 in accordance with an embodiment of the disclosure. The DSP 520 may correspond to the DSP 501 of FIG. 5A or another DSP embodiment. As shown in FIG. 5C, the DSP 520 comprises a processor core 530 coupled to a memory 522 that stores inverter control instructions 524. In alternative embodiments, the inverter control instructions 524 are not stored in the DSP 520, but are available via an external communication interface (e.g., coupled to an external memory). The processor core 530 also couples to an ADC 526 that provides voltage samples (e.g., $V_{shunt}$ samples) and couples to PWM control lines 528. As shown, the output of the PWM control lines 528 may be provided to an external PWM driver.

In accordance with at least some embodiments, the inverter control instructions 524 cause the processor core 530 to inspect timing parameters of an initial set of PWM control signals and to identify a measurement conflict for the ADC 526 when at least two of the PWM control signals are to be asserted within a predetermined amount of time of each other. If there is a measurement conflict, the inverter control instructions 524 cause the processor core 530 to provide a first modified set of PWM control signals to the PWM control lines 528. The first modified set of PWM control signals avoids the measurement conflict and has a voltage vector approximately equal to the initial set of PWM control signals. In at least some embodiments, the processor core 530 generates the first modified set of PWM control signals by nullifying the initial PWM control signal which has the least width, reducing a duty cycle of the other two initial PWM control signals related to the measurement conflict, and shifting the reduced PWM control signals in opposite directions. Based on the first modified set of PWM control signals, the inverter control instructions 524 cause the processor core 530 to determine current outputs ($I_a$, $I_b$, $I_c$) of a three-phase inverter based on ADC samples that enable a direct calculation for two of the inverter phase currents and a deduced calculation for one of the inverter phase currents. In at least some embodiments, the measurements to determine $I_a$, $I_b$, $I_c$ based on the first modified set of PWM control signals are performed within a single PWM cycle so that the next cycle of PWM control signals may be based on the latest $I_a$, $I_b$, $I_c$ measurements.

If there is not a measurement conflict, the inverter control instructions 524 cause the processor core 530 to provide a second modified set of PWM control signals to the PWM control lines. The second modified set of PWM control signals has a voltage vector approximately equal to the initial set of PWM control signals. In at least some embodiments, the processor core 530 generates the second modified set of control signals by shifting the smallest control signal (e.g., the control signal with the smallest duty cycle) from the initial set to be aligned (rising edges or falling edges) with the largest control signal of the initial set. Based on the second modified set of PWM control signal, the inverter control instructions 524 cause the processor core 530 to determine current outputs of a three-phase inverter based on ADC samples that enable a direct calculation for one of the inverter phase currents and a deduced calculation for two of the inverter phase currents. In at least some embodiments, the measurements to determine $I_a$, $I_b$, $I_c$ based on the second modified set of PWM control signals are performed within a single PWM cycle so that the next cycle of PWM control signals may be based on the latest $I_a$, $I_b$, $I_c$ measurements.

Figure 6A:
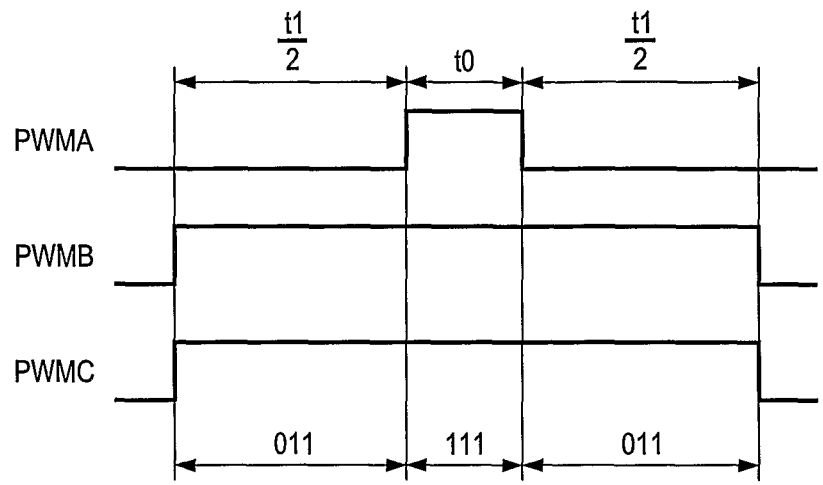
FIGS. 6A-6C show a transition of an initial set of control signals to a first modified set of control signals in accordance with an embodiment of the disclosure.
Figure 6B:
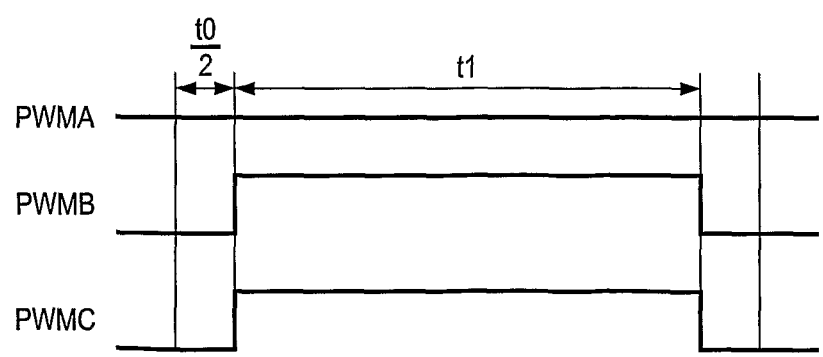
Figure 6C:
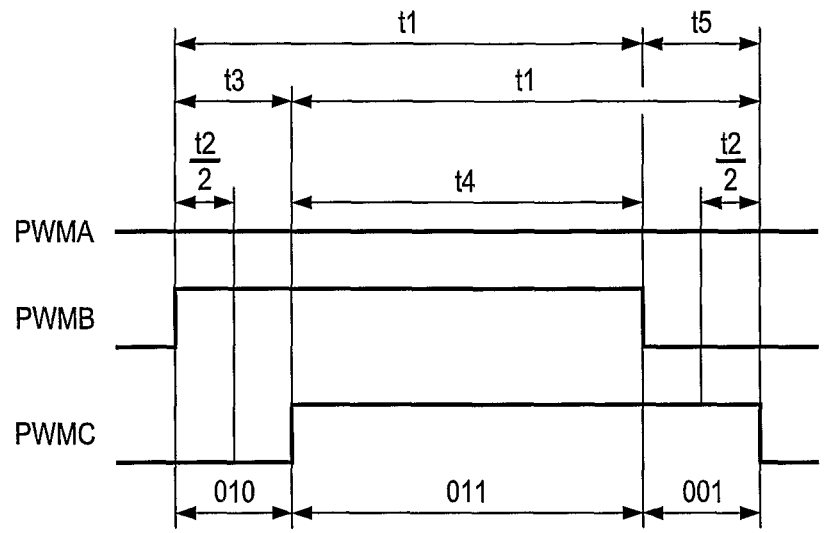

FIGS. 6A-6C show a transition of an initial set of control signals to a first modified set of control signals in accordance with an embodiment of the disclosure. In FIG. 6A, three PWM signals PWMA, PWMB and PWMC are shown with a first control state (011) for a duration $$\frac{t_1}{2},$$

a second control state (111) for a duration $t_0$, and a third control state 011 for a duration $$\frac{t_1}{2}.$$

In general, the control signals PWMA, PWMB and PWMC provide up to eight different control states (000, 001, 010, 011, 100, 101, 110, 111) where the first digit corresponds to PWMA, the second digit corresponds to PWMB, and the third digit corresponds to PWMC ("0" is a de-asserted state and "1" is an asserted state). Thus in FIG. 6A, the first control state (011) corresponds to when PWMA is de-asserted and PWMB and PWMC are asserted. The second control state (111) corresponds to when PWMA, PWMB and PWMC are all asserted. The third control state (011) again corresponds to when PWMA is de-asserted and PWMB and PWMC are asserted. As previously mentioned, $I_{dc}=0$ when the control state is 111. Thus, measurement of $I_{dc}$ during the second control state (duration $t_0$) does not provide useful information. Further, the first and third control states are the same and will only enable deducing one current by measuring $I_{dc}$ during either or both of the first and third control states. The scenario of FIG. 6A represents a measurement conflict for $I_{dc}$ in which not all of the current outputs ($I_a$, $I_b$, and $I_c$) of a three-phase inverter can be determined even with knowledge of the PWM control signals (i.e., $I_a$ can be determined, but not $I_b$ and $I_a$).

FIG. 6B shows an intermediate stage of compensating for the measurement conflict of FIG. 6A. As shown in FIG. 6B, PWMA is eliminated and PWMB and PWMC are reduced by an amount approximately equal to the duration ($t_0$) of the second control state (111). FIG. 6C shows a final stage of compensating for the measurement conflict of FIG. 6A. As shown in FIG. 6C, the reduced versions of PWMB and PWMC are shifted by an amount $t_2$. More specifically, PWMB is shifted forward by $$\frac{t_2}{2}$$

and PWMC is shifted back by $$\frac{t_2}{2}.$$

In general, the amount of shifting may vary as long as measurement conflict is overcome ($I_a$, $I_b$, and $I_c$ are measureable in a single PWM cycle) and the shifting does not extend any control signals beyond the boundaries of the initial PWM cycle.

With the control signals of FIG. 6C, all three current outputs ($I_a$, $I_b$, and $I_c$) of a three-phase inverter can be determined during a single PWM cycle. Specifically, during $t_3$, $I_b$ can be directly determined based on the values of $R_{shunt}$ and a $V_{shunt}$ measurement. During $t_4$, $I_a$ can be deduced based on the values of $R_{shunt}$ and a $V_{shunt}$ measurement to determine the combination of $I_b$ and $I_c$. $I_a$ is thereafter deduced using the formula $I_a+I_b+I_c=0$. During $t_5$, $I_c$ can be directly determined based on the values of $R_{shunt}$ and a $V_{shunt}$ measurement.

Figure 6D:
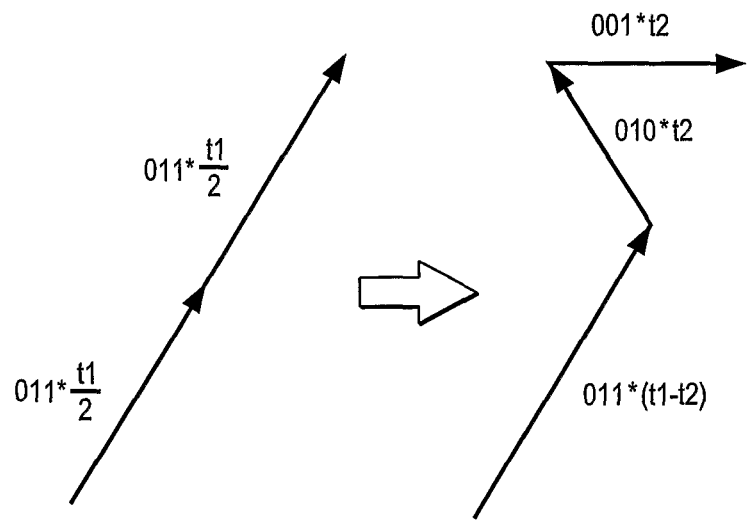
FIG. 6D shows a voltage vector for the initial set of control signals in FIG. 6A compared to a voltage vector for the first modified set of control signals in FIG. 6C.

FIG. 6D shows a voltage vector for the initial set of control signals in FIG. 6A compared to a voltage vector for the first modified set of control signals in FIG. 6C. As shown in FIG. 6D, the voltage vector for the first modified set of control signals is equal to the initial set of control signals. In other words, $$(011) \times \left(\frac{t_1}{2}\right) \times 2 = (011) \times (t_1 - t_2) + (010) \times (t_2) + (001) \times (t_2).$$

A similar control signal modification technique could be implemented for when there is a measurement conflict between PWMA and PWMC. In such case, PWMB is eliminated, PWMA and PWMC are reduced, and both of PWMA and PWMC are shifted to overcome the measurement conflict as described for FIGS. 6B and 6C. A similar control signal modification technique could be implemented for when there is a measurement conflict between PWMA and PWMB. In such case, PWMC is eliminated, PWMA and PWMB are reduced, and both of PWMA and PWMB are shifted to overcome the measurement conflict as described for FIGS. 6B and 6C. For each alternative modification, the voltage vector of the modified set of control signals is approximately equal to the voltage vector of the initial set of control signals.

Figure 7A:
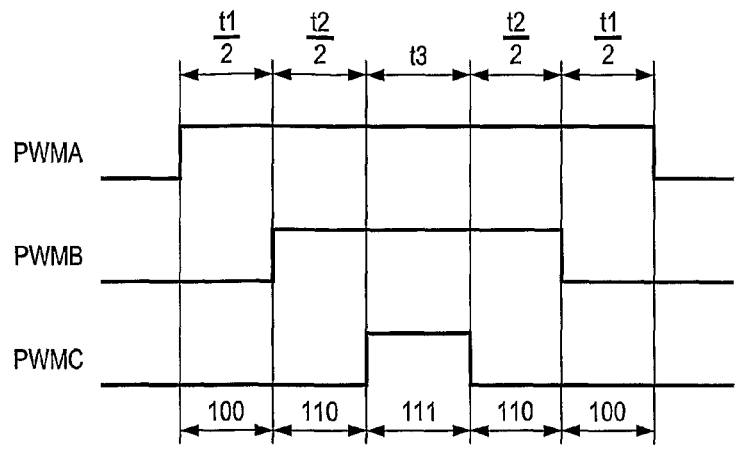
FIGS. 7A-7B show a transition of an initial set of control signals to a second modified set of control signals in accordance with an embodiment of the disclosure.
Figure 7B:
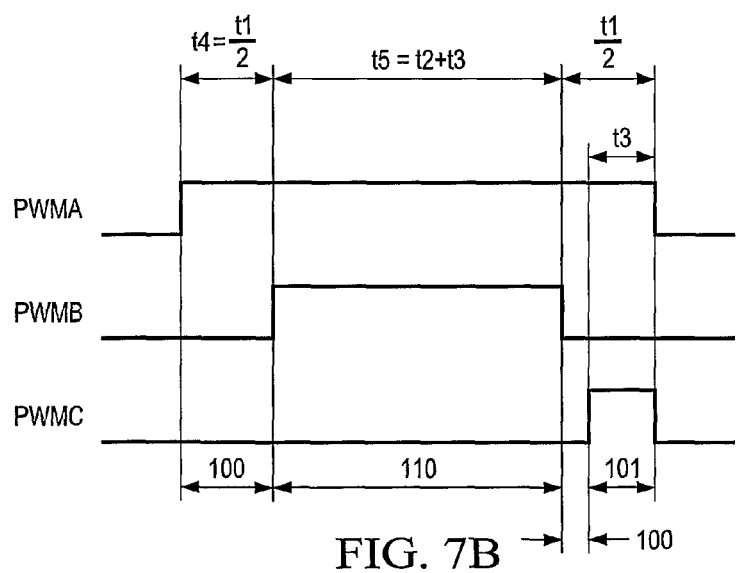

FIGS. 7A-7B show a transition of an initial set of control signals to a second modified set of control signals in accordance with an embodiment of the disclosure. In FIG. 7A, three PWM signals PWMA, PWMB and PWMC are shown with a first control state (100) for a duration $$\frac{t_1}{2},$$

a second control state (110) for a duration $$\frac{t_2}{2},$$

a third control state (111) for a duration $t_3$, a fourth control state (110) for a duration $$\frac{t_2}{2},$$

and a fifth control state for a duration $$\frac{t_1}{2}.$$

As previously discussed, the control signals PWMA, PWMB and PWMC provide up to eight different control states (000, 001, 010, 011, 100, 101, 110, 111) where the first digit corresponds to PWMA, the second digit corresponds to PWMB, and the third digit corresponds to PWMC ("0" is a de-asserted state and "1" is an asserted state). Thus in FIG. 7A, the first control state (100) corresponds to when PWMA is asserted and PWMB and PWMC are de-asserted. The second control state (110) corresponds to when PWMA and PWMB are asserted and PWMC is de-asserted. The third control state (111) corresponds to when PWMA, PWMB, and PWMC are all asserted. The fourth control state (110) again corresponds to when PWMA and PWMB are asserted and PWMC is de-asserted. The fifth control state (100) corresponds to when PWMA is asserted and PWMB and PWMC are de-asserted.

As shown in FIG. 7B, PWMC is shifted so that the falling edge of PWMC is aligned with the falling edge of PWMA. For at least some embodiments, the second modified set of control signals is provided by shifting the smallest control signal (e.g., the control signal having the smallest duty cycle) so that the falling edge of the smallest control signal is aligned with the falling edge of the largest control signal (e.g., the control signal having the largest duty cycle). Alternatively, the second modified set of control signals is provided by shifting the smallest control signal so that the rising edge of the smallest control signal is aligned with the rising edge of the largest control signal.

With the control signals of FIG. 7B, all three current outputs ($I_a$, $I_b$, and $I_c$) of a three-phase inverter can be determined during a single PWM cycle. Specifically, during $t_4$, $I_a$ can be directly determined based on the values of $R_{shunt}$ and a $V_{shunt}$ measurement. During $t_5$, $I_c$ can be deduced based on the values of $R_{shunt}$ and a $V_{shunt}$ measurement to determine the combination of $I_a$ and $I_b$. $I_c$ is thereafter deduced using the formula $I_a+I_b+I_c=0$. During $t_3$, $I_b$ can be deduced based on the values of $R_{shunt}$ and a $V_{shunt}$ measurement to determine the combination of $I_a$ and $I_c$. $I_b$ is thereafter deduced using the formula $I_a+I_b+I_c=0$.

Figure 7C:
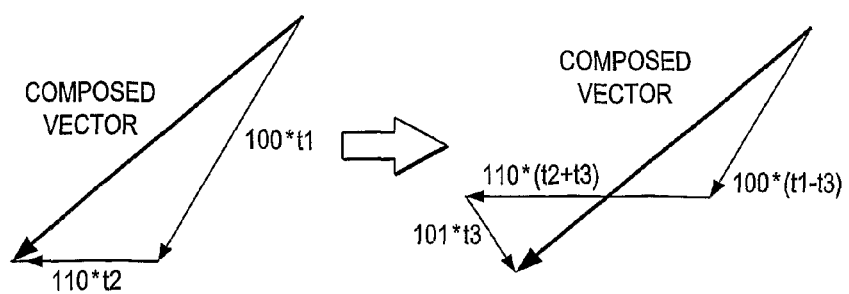
FIG. 7C shows a voltage vector for the initial set of control signals in FIG. 7A compared to a voltage vector for the second modified set of control signals in FIG. 7B.

FIG. 7C shows a voltage vector for the initial set of control signals in FIG. 7A compared to a voltage vector for the second modified set of control signals in FIG. 7B. As shown in FIG. 7C, the voltage vector for the second first modified set of control signals is equal to the initial set of control signals. In other words, $(100) \times (t_1) + (110) \times (t_2) = (100) \times (t_1-t_3) + (110) \times (t_2+t_3) + (101) \times (t_3)$.

A similar control signal modification technique could be implemented for when there is no measurement conflict and when PWMC is the smallest control signal and PWMB is the largest control signal. In such case, PWMC is shifted so that the falling edge of PWMC is aligned with the falling edge of PWMB. Alternatively, the rising edge of PWMC is aligned with the rising edge of PWMB.

A similar control signal modification technique could be implemented for when there is no measurement conflict and when PWMB is the smallest control signal and PWMA is the largest control signal. In such case, PWMB is shifted so that the falling edge of PWMB is aligned with the falling edge of PWMA. Alternatively, the rising edge of PWMB is aligned with the rising edge of PWMA. A similar control signal modification technique could be implemented for when there is no measurement conflict and when PWMB is the smallest control signal and PWMC is the largest control signal. In such case, PWMB is shifted so that the falling edge of PWMB is aligned with the falling edge of PWMC. Alternatively, the rising edge of PWMB is aligned with the rising edge of PWMC.

A similar control signal modification technique could be implemented for when there is no measurement conflict and when PWMA is the smallest control signal and PWMC is the largest control signal. In such case, PWMA is shifted so that the falling edge of PWMA is aligned with the falling edge of PWMC. Alternatively, the rising edge of PWMA is aligned with the rising edge of PWMC. A similar control signal modification technique could be implemented for when there is no measurement conflict and when PWMA is the smallest control signal and PWMB is the largest control signal. In such case, PWMA is shifted so that the falling edge of PWMA is aligned with the falling edge of PWMB. Alternatively, the rising edge of PWMA is aligned with the rising edge of PWMB. For these different scenarios, the voltage vector for each modified set of control signals is equal to the initial set of control signals.

Figure 8:
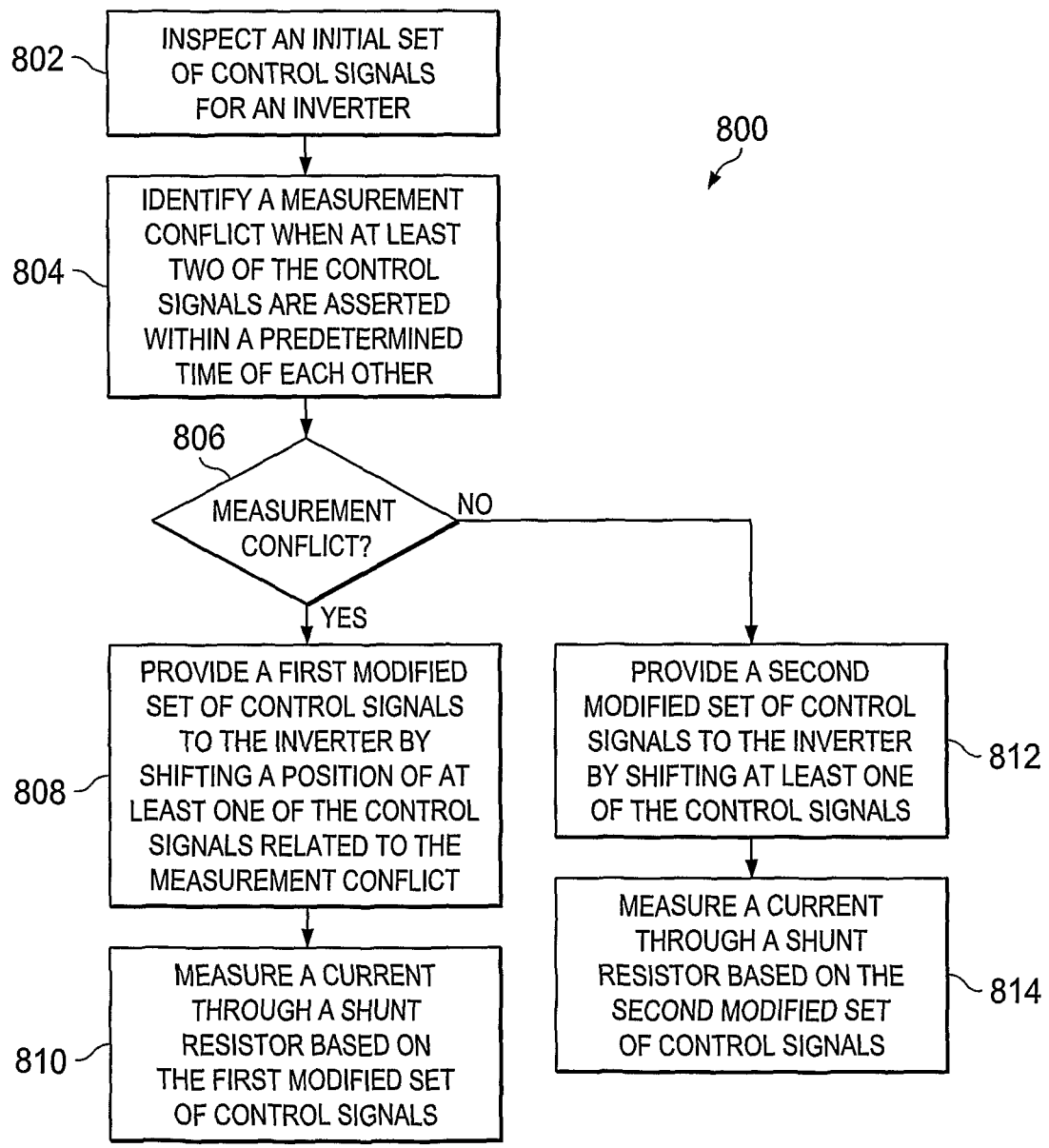
FIG. 8 shows a method in accordance with an embodiment of the disclosure.

FIG. 8 shows a method 800 in accordance with an embodiment of the disclosure. The method 800 is used, for example, to determine each current output of a three-phase inverter. The method 80 may be performed by a DSP or another controller for the inverter. As shown, the method 800 comprises inspecting an initial set of control signals for the inverter (block 802) and identifying whether a measurement conflict exists when at least two of the control signals are asserted within a predetermined time of each other (block 804. If there is a measurement conflict (decision block 806), the method 800 comprises providing a first modified set of control signals to the inverter by shifting a position of at least one of the control signals related to the measurement conflict (block 808). In accordance with at least some embodiments, the shifting at block 808 separates the control signals related to the measurement conflict by at least a predetermined analog-to-digital converter (ADC) sample-and-hold (S/H) time period. Providing the first modified set of control signals at block 808 also may comprise nullifying one of the initial set of control signals (e.g., the control signal not related to the measurement conflict). Providing the first modified set of control signals at block 808 also may comprise reducing a duty cycle for each control signal related to the measurement conflict by an amount equal to the nullified control signal. In at least some embodiments, the first modified set of control signals maintains a voltage vector approximately equal to the initial set of control signals.

At block 810, the method 800 measures a current through a shunt resistor (the input current and output current of the inverter flows through the shunt resistor) based on the first modified set of control signals. In accordance with at least some embodiments, measuring a current through the shunt resistor based on the first modified set of control signals enables the current outputs of the three-phase inverter to be determined in a single control signal cycle based on two direct current measurements and one deduced current measurement.

If there is not a measurement conflict (decision block 806), the method 800 comprises providing a second modified set of control signals to the inverter by shifting a position of at least one of the control signals (block 812). In at least some embodiments, providing a second modified set of control signals at block 812 comprises shifting the smallest control signal (e.g., the control signal having the smallest duty cycle) so that the falling edge of the smallest control signal is aligned with the falling edge of the largest control signal (e.g., the control signal having the largest duty cycle). Alternatively, providing a second modified set of control signals at block 812 comprises shifting the smallest control signal so that the rising edge of the smallest control signal is aligned with the rising edge of the largest control signal. The second modified set of control signals preferably maintains a voltage vector approximately equal to the initial set of control signals.

At block 814, the method 800 comprises measuring a current through a shunt resistor based on the second modified set of control signals. In accordance with at least some embodiments, measuring a current through the shunt resistor based on the second modified set of control signals enables the current outputs of the three-phase inverter to be determined in a single control signal cycle based on one direct current measurement and two deduced current measurements.

The above discussion is meant to be illustrative of the principles and various embodiments of the present invention. Numerous other variations and modifications will become apparent to those skilled in the art once the above disclosure is fully appreciated. It is intended that the following claims be interpreted to embrace all such variations and modifications.

What is claimed is:

1. A method for determining each current output of a three-phase inverter, comprising:
supplying an initial set of control signals for the inverter for control of a load connected to an output of inverter;
inspecting the initial set of control signals for the inverter;
identifying a measurement conflict when at least two of said control signals are asserted within a predetermined amount of time of each other;
when there is a measurement conflict, supplying a first modified set of control signals to the inverter for control of the load by shifting a position of at least one control signal related to the measurement conflict, wherein providing the first modified set of control signals comprises nullifying one of the initial set of control signals;
measuring a current through a shunt resistor based on the first modified set of control signals; and
supplying a further set of control signals for the inverter for control of the load dependent upon the measured current through the shunt resistor.

2. The method of claim 1 wherein said measuring a current through a shunt resistor based on the first modified set of control signals enables the current outputs of the three-phase inverter to be determined in a single control signal cycle based on two direct current measurements and one deduced current measurement.

3. The method of claim 1 wherein said shifting separates the control signals related to the measurement conflict by at least a predetermined analog-to-digital converter (ADC) sample-and-hold (S/H) time period.

4. The method of claim 1 wherein providing the first modified set of control signals comprises reducing a duty cycle for each control signal related to the measurement conflict by an amount equal to the nullified control signal.

5. A method for determining each current output of a three-phase inverter, comprising:
supplying an initial set of control signals for the inverter for control of a load connected to an output of inverter;
inspecting the initial set of control signals for the inverter;
identifying a measurement conflict when at least two of said control signals are asserted within a predetermined amount of time of each other;
when there is a measurement conflict, providing supplying a first modified set of control signals for control of the load to the inverter by shifting a position of at least one control signal related to the measurement conflict, wherein the first modified set of control signals maintains a voltage vector approximately equal to the initial set of control signals;
measuring a current through a shunt resistor based on the first modified set of control signals; and
supplying a further set of control signals for the inverter for control of the load dependent upon the measured current through the shunt resistor.

6. A method for determining each current output of a three-phase inverter, comprising:
supplying an initial set of control signals for the inverter for control of a load connected to an output of inverter;
inspecting the initial set of control signals for the inverter;
identifying a measurement conflict when at least two of said control signals are asserted within a predetermined amount of time of each other;
when there is a measurement conflict, providing supplying a first modified set of control signals for control of the load to the inverter by shifting a position of at least one control signal related to the measurement conflict;
when there is not a measurement conflict:
providing a second modified set of control signals to the inverter for control of the load by shifting a position of at least one control signal; and
measuring a current through a shunt resistor based on the second modified set of control signals; and
supplying a further set of control signals for the inverter for control of the load dependent upon the measured current through the shunt resistor.

7. The method of claim 6 wherein said measuring a current through a shunt resistor based on the second modified set of control signals enables the current outputs of the three-phase inverter to be determined in a single control signal cycle based on one direct current measurement and two deduced current measurements.

8. The method of claim 6 wherein the second modified set of control signals maintains a voltage vector approximately equal to the initial set of control signals.

9. An electronic device, comprising:
a three-phase inverter;
a shunt resistor coupled to the three-phase inverter; and
control logic coupled to the inverter, wherein the control logic determines each current output of the three-phase inverter by:

inspecting an initial set of control signals for the inverter;

identifying a measurement conflict when at least two of the initial set of control signals are asserted within a predetermined amount of time of each other;

when there is a measurement conflict, providing a first modified set of control signals to the three-phase inverter, the first modified set of control signals avoid the measurement conflict and have a voltage vector approximately equal to the initial set of PWM control signals, wherein the control logic provides the first modified set of control signals by nullifying one of the initial control signals, reducing an "on" period for two initial control signals related to the measurement conflict, and shifting the control signals with reduced "on" periods in opposite directions; and measuring a current through the shunt resistor based on the first modified set of control signals.

10. The electronic device of claim 9 wherein, for the first modified set of control signals, the control logic determines the current outputs of the three-phase inverter based on two direct measurements and one deduced measurement.

11. The electronic device of claim 9 wherein the control logic comprises a digital signal processor (DSP) having pulse width modulation (PWM) control lines and an analog-to-digital converter (ADC) input line.

12. An electronic device comprising:
a three-phase inverter;
a shunt resistor coupled to the three-phase inverter; and
control logic coupled to the inverter, wherein the control logic determines each current output of the three-phase inverter by:
inspecting an initial set of control signals for the inverter;
identifying a measurement conflict when at least two of the initial set of control signals are asserted within a predetermined amount of time of each other;
when there is a measurement conflict, providing a first modified set of control signals to the three-phase inverter, the first modified set of control signals avoid the measurement conflict and have a voltage vector approximately equal to the initial set of PWM control signals;
when there is not a measurement conflict, the control logic determines each current output of the three-phase inverter by:
providing a second modified set of control signals to the inverter, the second modified set of control signals having a voltage vector approximately equal to the initial set of control signal; and
measuring a current through a shunt resistor based on the second modified set of control signals.

13. The electronic device of claim 12 wherein, for the second modified set of control signals, the control logic determines the current outputs of the three-phase inverter based on one direct measurement and two deduced measurements.

14. A digital signal processor (DSP) for determining each current output of a three-phase inverter, comprising:
pulse width modulation (PWM) control lines;
an analog-to-digital converter (ADC);
a processor coupled to the PWM control lines and the ADC; and
memory coupled to the processor, wherein the memory stores instructions that cause the processor to:
inspect timing parameters of an initial set of PWM control signals,
identify a measurement conflict for the ADC when at least two of the PWM control signals are to be asserted within a predetermined amount of time of each other;
when there is a measurement conflict, provide a first modified set of PWM control signals to the PWM control lines by nullifying one of the initial PWM control signals, reducing a duty cycle of two initial PWM control signals related to the measurement conflict, and shifting the reduced PWM control signals in opposite directions, wherein the first modified set of PWM control signals avoids the measurement conflict and has a voltage vector approximately equal to the initial set of control signals; and
determine each current output of a three-phase inverter using ADC samples based on the first modified set of PWM control signals.

15. The DSP of claim 14 wherein, for the first modified set of PWM control signals, the instructions cause the processor to determine the current outputs of the three-phase inverter based on ADC samples that enable a direct calculation for two of the phase currents and a deduced calculation for one of the phase currents.

16. A digital signal processor (DSP) for determining each current output of a three-phase inverter, comprising:
pulse width modulation (PWM) control lines;
an analog-to-digital converter (ADC);
a processor coupled to the PWM control lines and the ADC; and
memory coupled to the processor, wherein the memory stores instructions that cause the processor to:
inspect timing parameters of an initial set of PWM control signals,
identify a measurement conflict for the ADC when at least two of the PWM control signals are to be asserted within a predetermined amount of time of each other;
when there is a measurement conflict, provide a first modified set of PWM control signals to the PWM control lines, wherein the first modified set of PWM control signals avoids the measurement conflict and has a voltage vector approximately equal to the initial set of control signals; and
determine each current output of a three-phase inverter using ADC samples based on the first modified set of PWM control signals;
when there is not a measurement conflict, the instructions cause the processor to:
provide a second modified set of PWM control signals to the PWM control lines, the second modified set of PWM control signals having a voltage vector approximately equal to the initial set of PWM control signal; and
determine each current output of a three-phase inverter using ADC samples based on the second modified set of PWM control signals.

17. The DSP of claim 16 wherein, for the second modified set of PWM control signals, the instructions cause the processor to determine the current outputs of the three-phase inverter based on ADC samples that enable a direct calculation for one of the phase currents and a deduced calculation for two of the phase currents.

* * * * *